United States Patent [19]
Ito

[11] Patent Number: 5,187,648
[45] Date of Patent: Feb. 16, 1993

[54] GUIDE RAIL FOR A PRINTED CIRCUIT BOARD

[75] Inventor: Fuminori Ito, Nagoya, Japan

[73] Assignee: Kitagawa Industries Co., Ltd., Japan

[21] Appl. No.: 846,530

[22] Filed: Mar. 4, 1992

[30] Foreign Application Priority Data

Jul. 18, 1991 [JP] Japan ................. 3-56197[U]

[51] Int. Cl.[5] .................. H05K 9/00; A47G 19/08; H01R 9/09
[52] U.S. Cl. .................. 361/424; 174/35 R; 211/41; 361/415; 439/64; 439/65
[58] Field of Search .............. 174/35 R, 35 TS; 211/41; 361/412, 415, 417, 420, 424; 439/64, 65

[56] References Cited

U.S. PATENT DOCUMENTS

| | | | |
|---|---|---|---|
| 3,231,785 | 1/1966 | Calabro | 361/412 |
| 3,950,057 | 4/1976 | Calabro | 361/412 |
| 4,019,099 | 4/1977 | Calabro | 361/412 |
| 4,096,547 | 8/1978 | Calabro | 439/64 |
| 4,098,046 | 7/1978 | Papa | 211/41 |
| 4,377,315 | 3/1983 | Grau | 439/64 |
| 4,574,332 | 3/1986 | Calabro | 361/412 |

FOREIGN PATENT DOCUMENTS 0399091 11/1990 European Pat. Off. ......... 361/415
1282758 11/1968 Fed. Rep. of Germany ...... 361/415

Primary Examiner—Leo P. Picard
Assistant Examiner—D. Sparks
Attorney, Agent, or Firm—Davis, Bujold & Streck

[57] ABSTRACT

A guide rail for a printed circuit board mounted in a partially conductive housing comprises a conductive guide member and an insulative fixing member. The guide member is inserted into a receiving portion of the fixing member from an inlet formed in the bottom thereof. In this condition, contact members of the guide member project outwardly from the inlet. Then, the fixtures of the fixing member are secured to the housing. Since the operator only touches the insulative fixing member to perform the above mounting, corrosion of the guide member is prevented. The contact members projecting outwardly from the inlet is deflected toward the receiving portion of the fixing member when the fixing member is secured to the housing, thereby intimately contacting to a conductive portion of the housing. Thus, a stable connection between the guide member and the housing is attained. Further, since the fixing member is formed of insulative material, short circuiting of the printed circuit board is prevented even if a member for supporting the board contacts the fixing member.

17 Claims, 15 Drawing Sheets

GUIDE RAIL FOR A PRINTED CIRCUIT BOARD

BACKGROUND OF THE INVENTION

This invention relates to a guide rail, mounted in a housing, which guides a circuit board to a desired position in the housing and supports the board therein.

A conventional guide rail basically comprises a rectangular guide member for guiding a printed circuit board to a desired position in a housing and a fixing member for securing the guide member at the position, both of which are formed of conductive metal. The guide member includes guide fingers which guide the printed circuit board and form an electrical connection with a conductive pattern on the board. The fixing member is provided with a frame in the longitudinal direction for supporting the guide member. The frame slidingly receives the guide member from one end to accommodate the guide member therein. The fixing member containing the guide member is then secured to the housing by suitable means, such as screws. Then the printed circuit board is inserted into the guide member so as to be guided to the desired position in the housing. When the board is set in the guide rail, the guide fingers of the guide member contact the conductive pattern on the board. Since the guide member and the fixing member are made of conductive metal, a connection between the conductive pattern and a conductive portion of the housing is attained. Therefore, it is possible to connect a ground pattern on the printed circuit board, for example, with the conductive portion of the housing via the guide rail so as to reduce the noise generated in a power source line of the printed circuit board.

However, such a prior-art guide rail for a printed circuit board has several problems. For example, a means for supporting the printed circuit board may connect with the guide rail by a casual contact therebetween. Further, the operator may carelessly touch the components of the guide rail upon securing the fixing member to the housing which causes corrosion of the components. Moreover, if the securing means to fix the guide rail to the housing becomes loose for some reason, such as a vibration caused during transportation, disconnection between the guide rail and the housing may occur, and thus a stable connection therebetween cannot be realized.

SUMMARY OF THE INVENTION

Wherefore, an object of the present invention is to provide a guide rail for a printed circuit board which attains functional improvements such as a more stable connection to the printed circuit board.

To attain the above object, the guide rail for a printed circuit board mounted in a partially conductive housing according to the present invention comprises a guide member formed of conductive material and a fixing member formed of insulative material. The guide member includes on the top face guide fingers which guide the printed circuit board and contact a conductive pattern on the board. On the bottom face, the guide member includes contact members which contact a conductive portion of the housing. The fixing member includes an inlet formed at the bottom through which the guide member is inserted, a receiving portion for accommodating the guide member with the contact members projecting from the inlet, a passage through which the printed circuit board is inserted to contact the guide fingers of the guide member, and fixtures to be secured to the housing.

According to the guide rail constructed as above, the conductive guide member is inserted from the inlet formed on the bottom of the insulative fixing member into the receiving portion thereof. In this condition, the contact members of the guide member project from the inlet. Then the fixtures of the fixing member are secured to the housing. Since the operator touches only the insulative fixing member to perform the above setting, corrosion of the guide member is prevented. The contact members projecting from the inlet deflect toward the receiving portion while the fixing member is secured to the housing, thereby intimately contacting to the conductive portion of the housing. Thus, a stable connection between the guide member and the housing is attained. Further, since the fixing member is formed of insulative material, short circuiting of the printed circuit board is prevented even if a means for supporting the board contacts the fixing member.

DETAILED DESCRIPTION OF A PREFERRED EMBODIMENT

Figure 1:
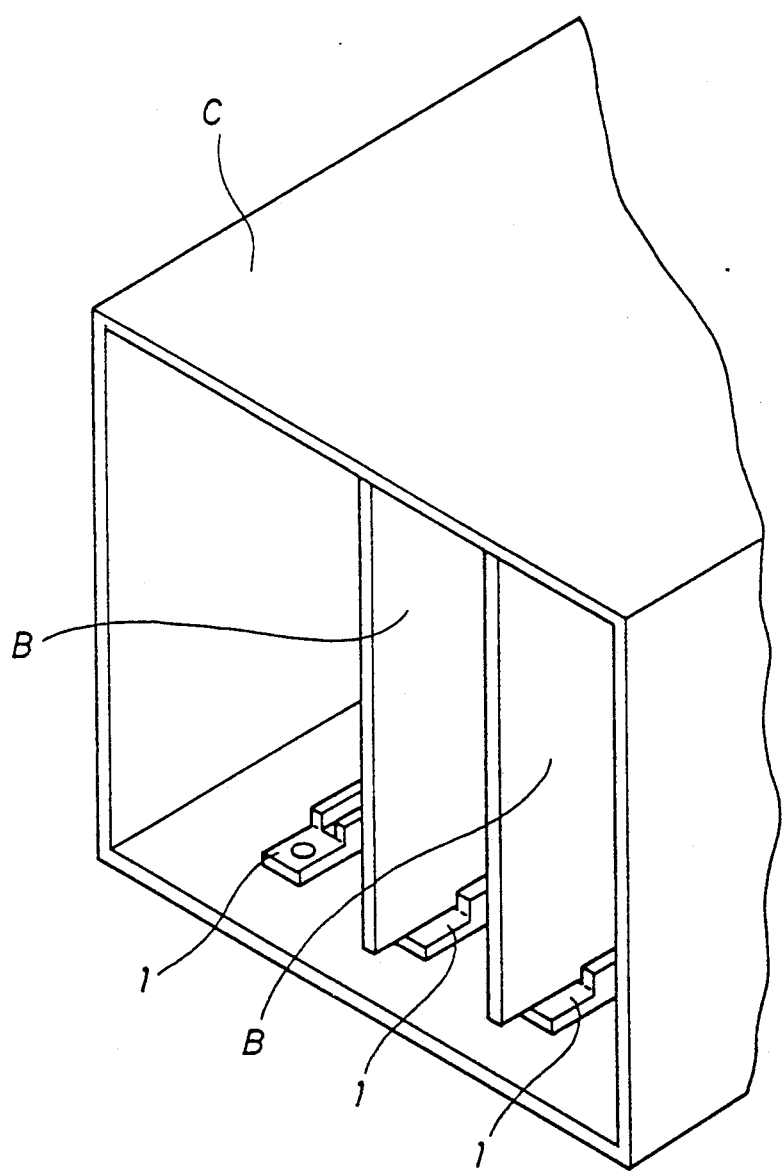
FIG. 1 is an explanatory illustration of a guide rail in use according to the present invention.
Figure 2:
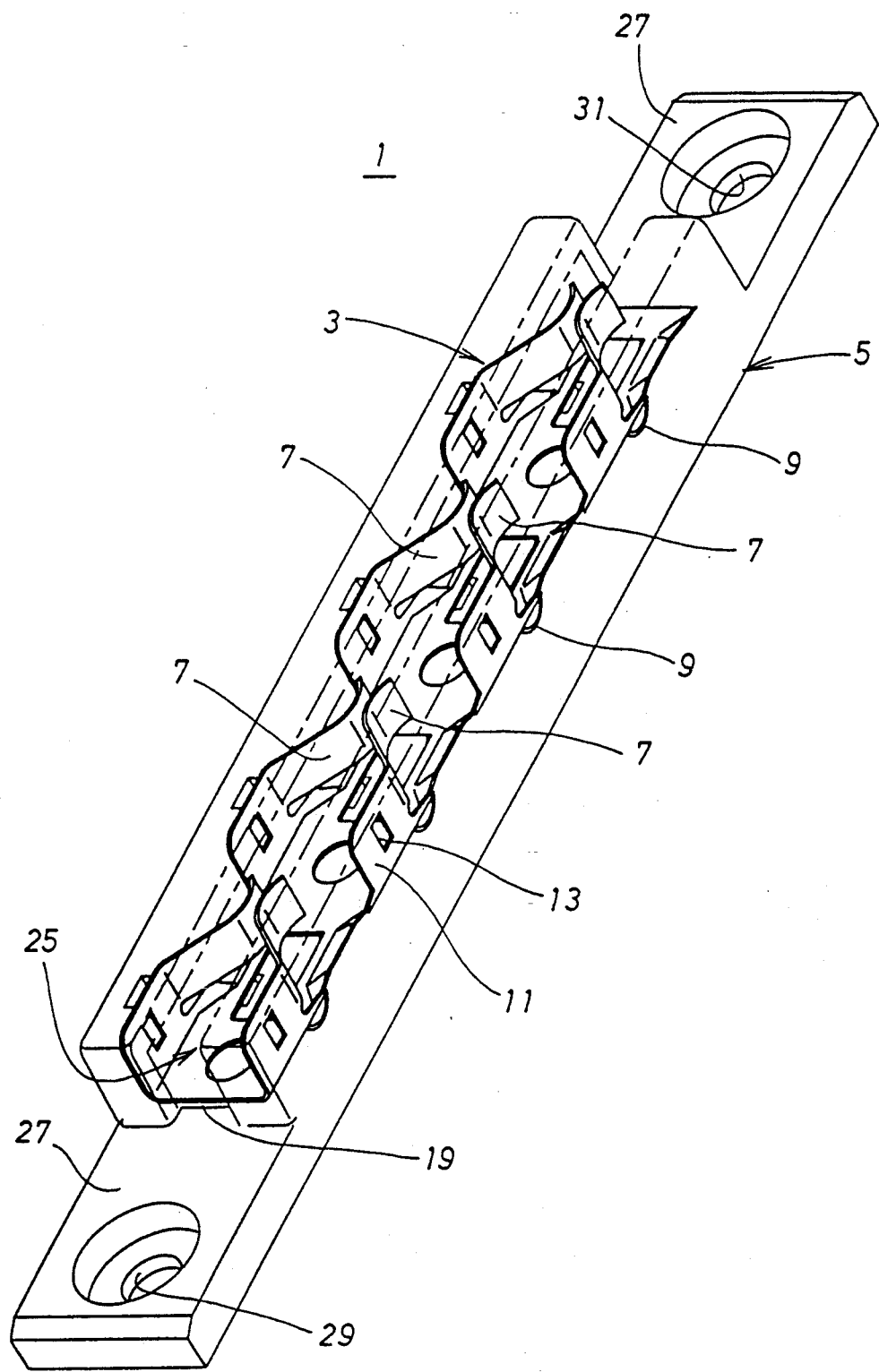
FIG. 2 is a diagrammatic perspective view of the guide rail.
Figure 3:
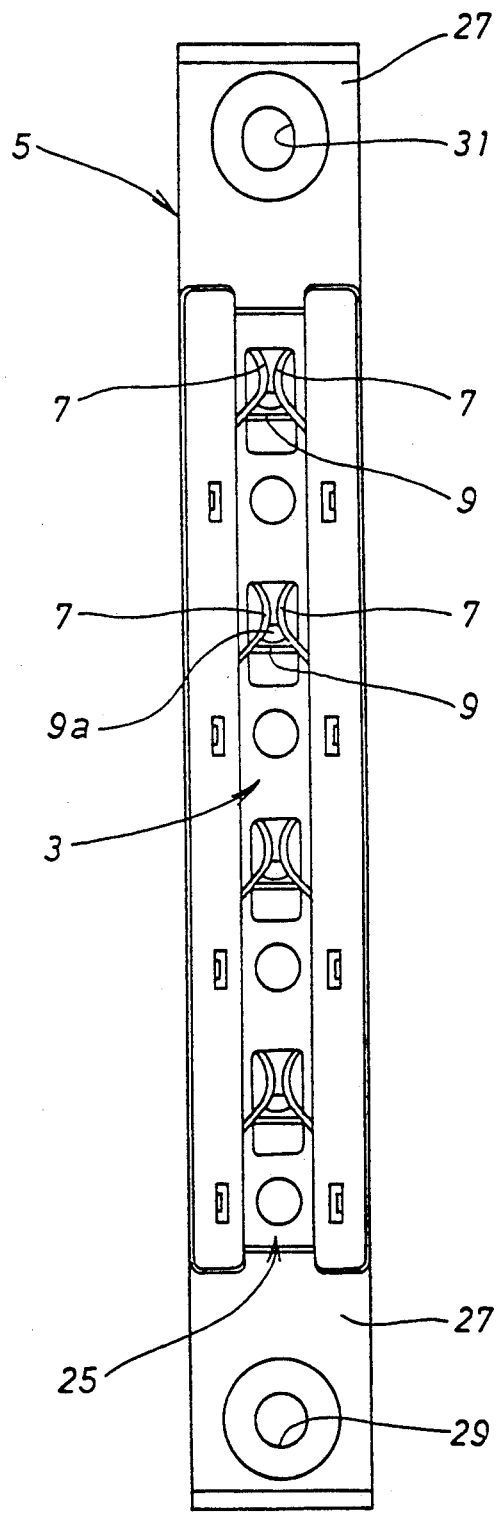
FIG. 3 is a plan view of the guide rail.
Figure 4:
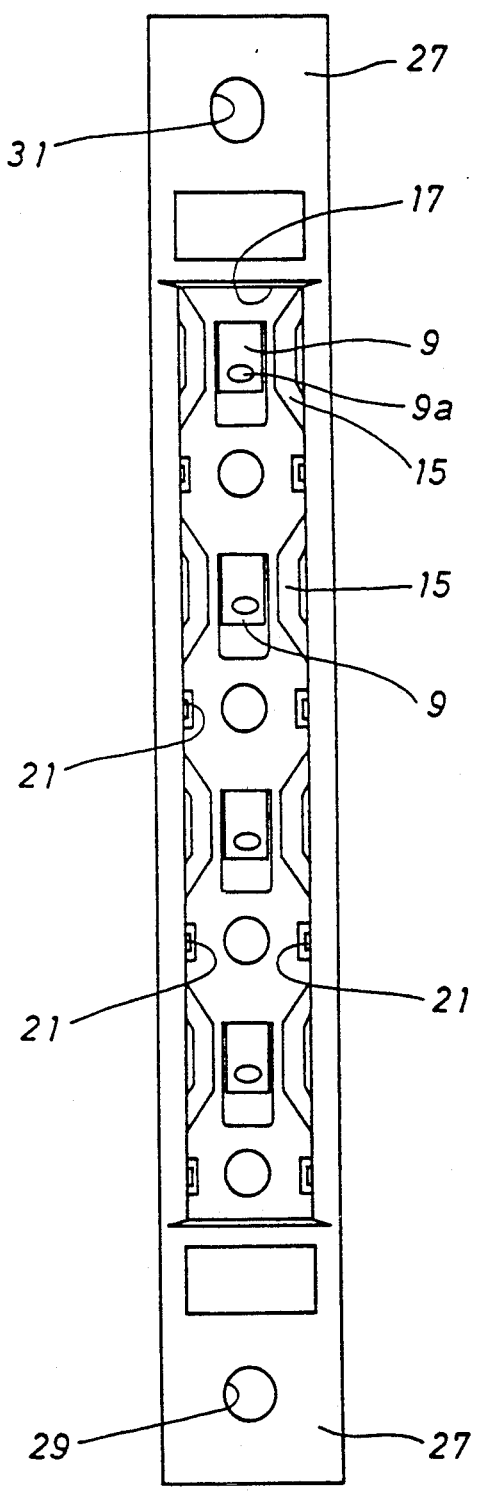
FIG. 4 is a bottom plan view of the guide rail.

As illustrated in FIG. 1, guide rails 1 are positioned in a partially conductive housing C in parallel spaced relationship to each other. The guide rails 1 guide printed circuit boards B to desired positions in the housing C and support the boards B therein. As shown in FIGS. 2 through 5, the respective guide rail 1 basically comprises a guide member 3 and a securing or fixing member 5. The guide member 3 is formed of conductive metal and provided with a plurality of pairs of opposed guide fingers 7 on the top face or surface and a plurality of contact members 9 on the bottom face or surface. The guide fingers 7 are operative to guide the printed circuit board B and contact a ground pattern on the board B. The contact members 9 in turn contact a conductive portion of the housing C.

Figure 6:
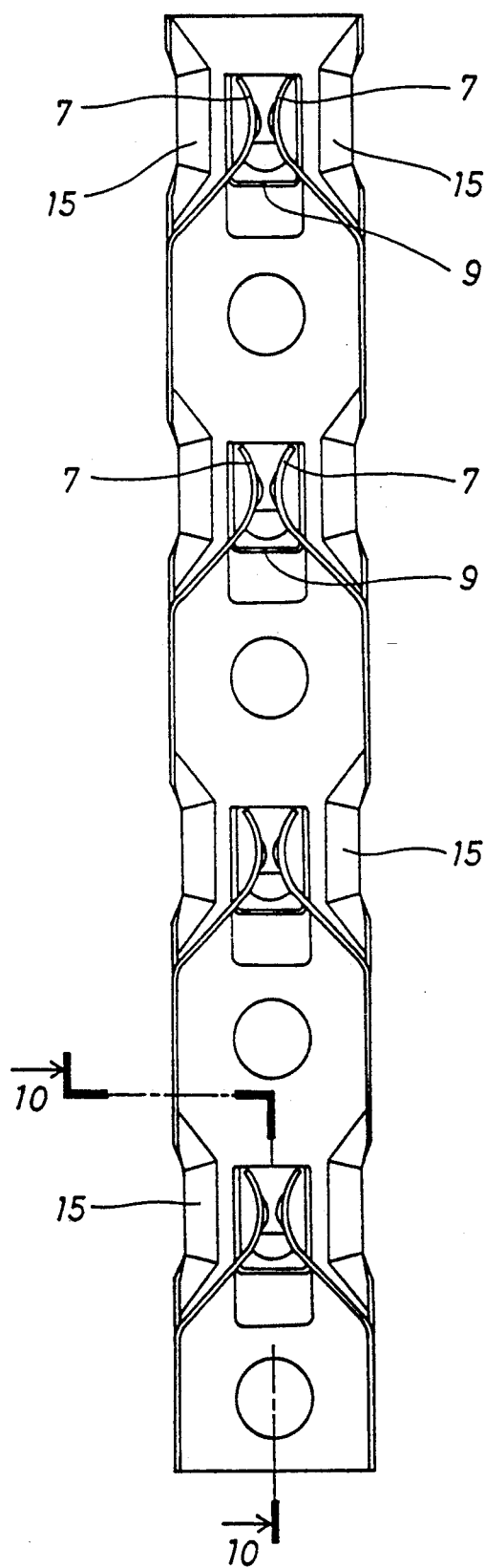
FIG. 6 is a plan view of a guide member of the guide rail.
Figure 7:
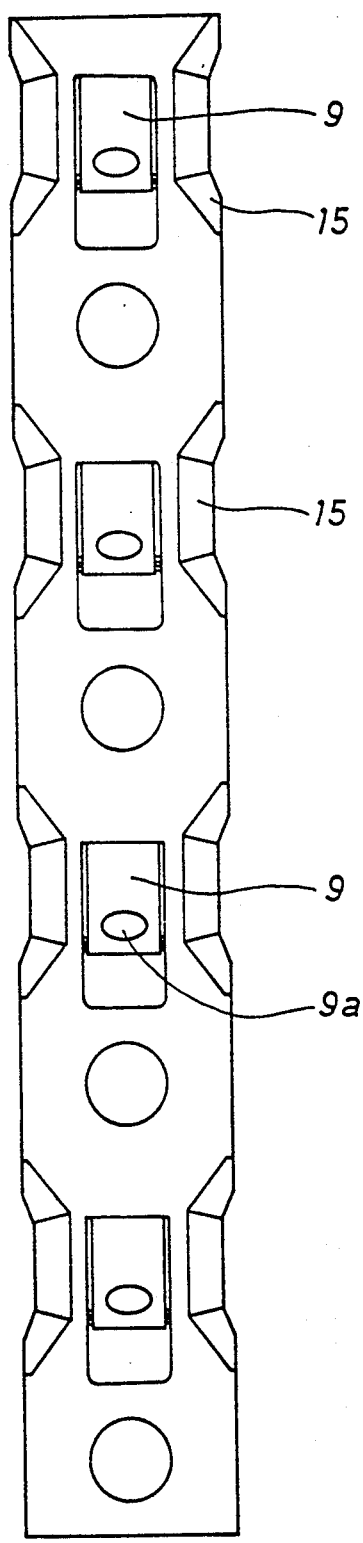
FIG. 7 is a bottom plan view of the guide member.
Figure 8:
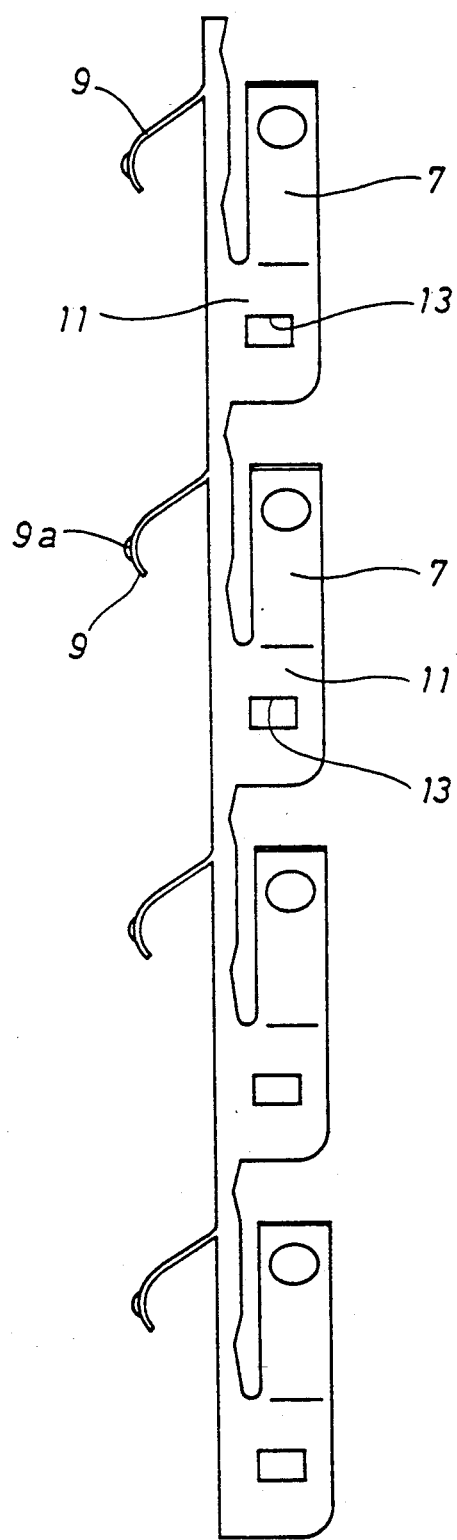
FIG. 8 is a side view of the guide member.
Figure 9:
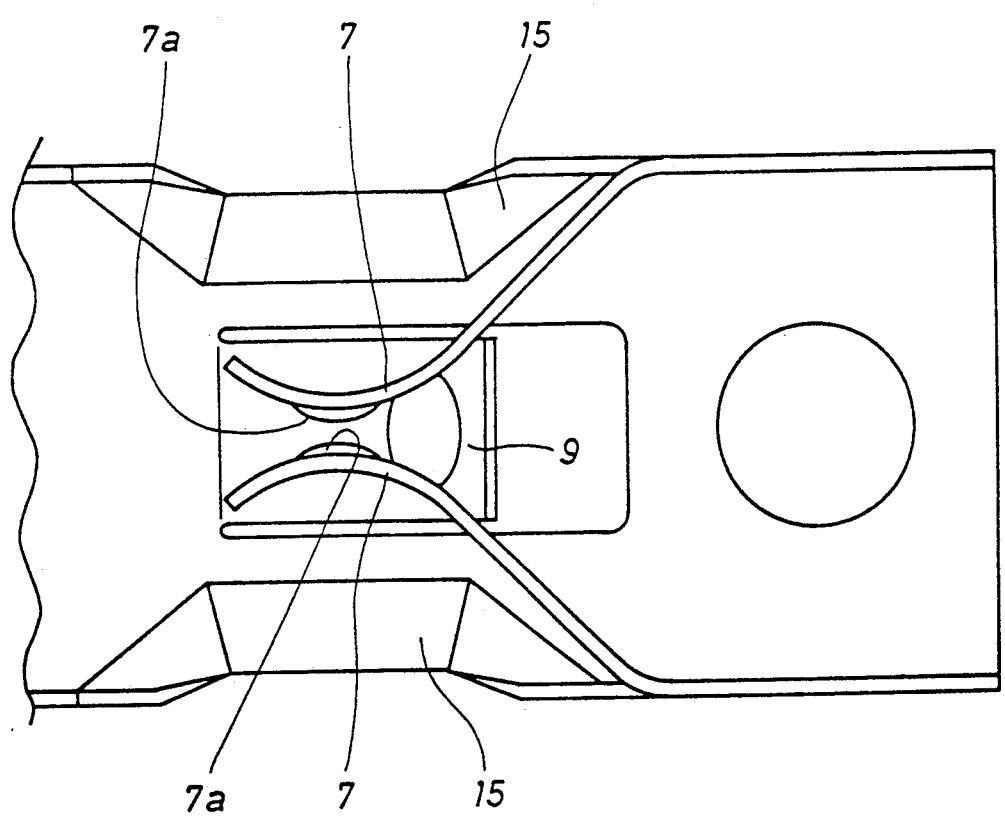
FIG. 9 is an enlarged view of a guide finger of the guide member.
Figure 10:
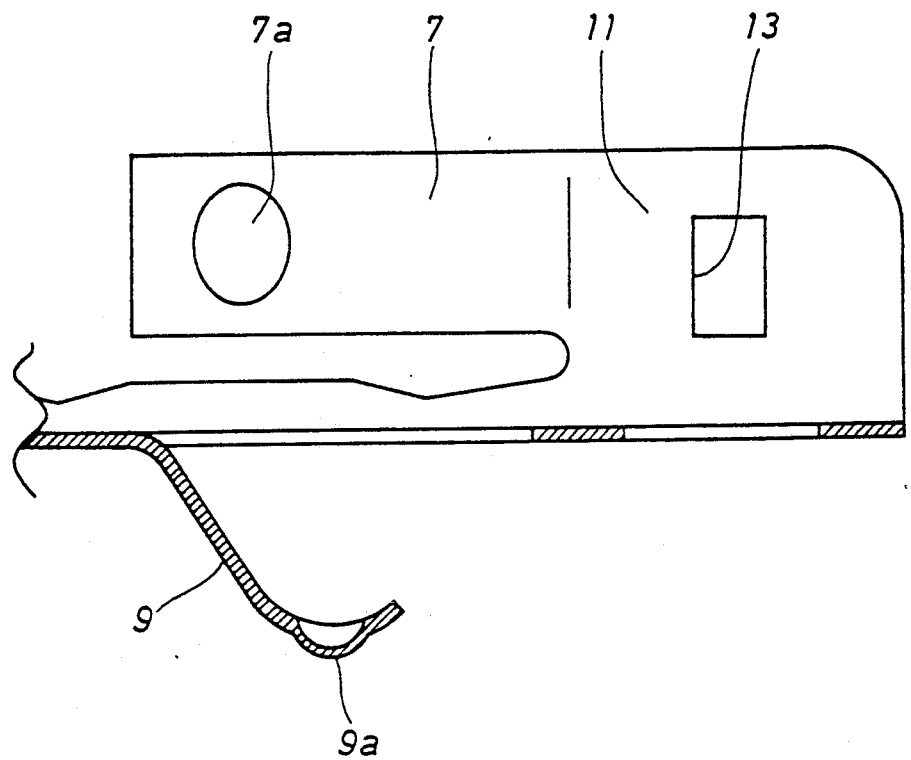
FIG. 10 is a sectional view taken along 10—10 line of FIG. 6, showing a section of a contact member of the guide member.
Figure 11:
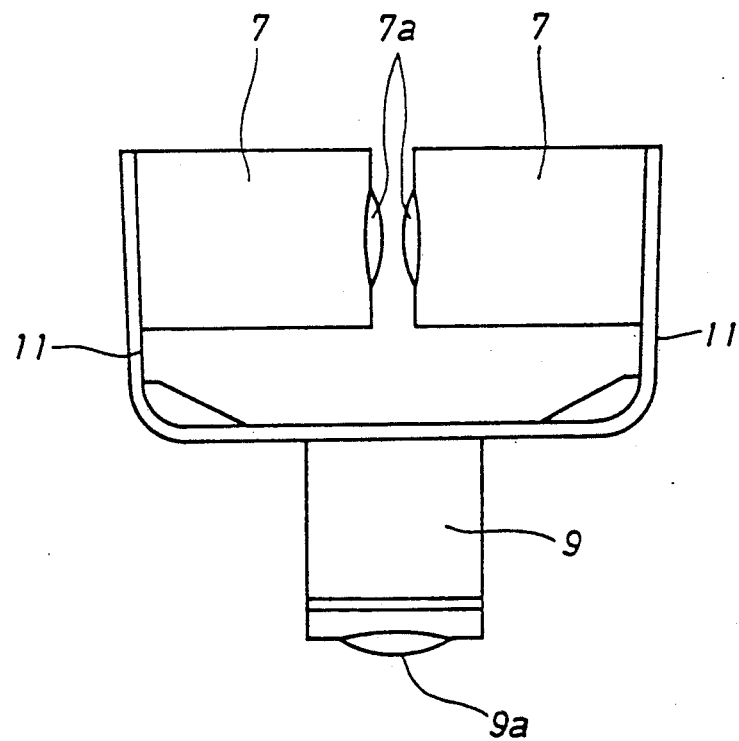
FIG. 11 is a front view of the guide member.
Figure 12:
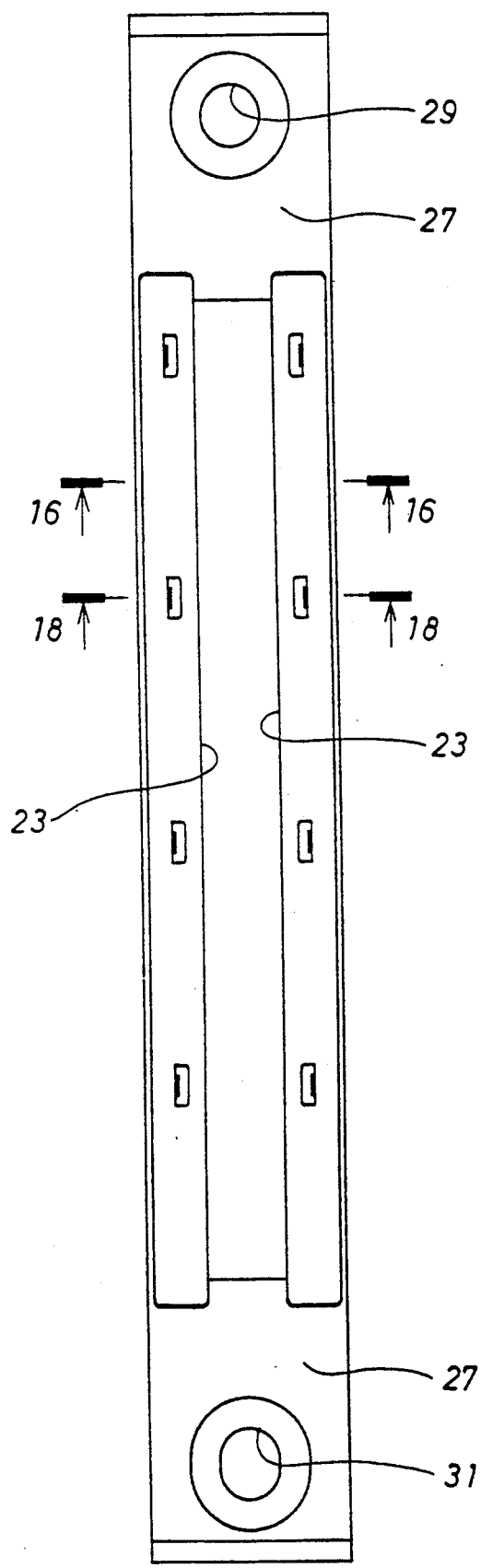
FIG. 12 is a plan view of a fixing member of the guide rail.
Figure 13:
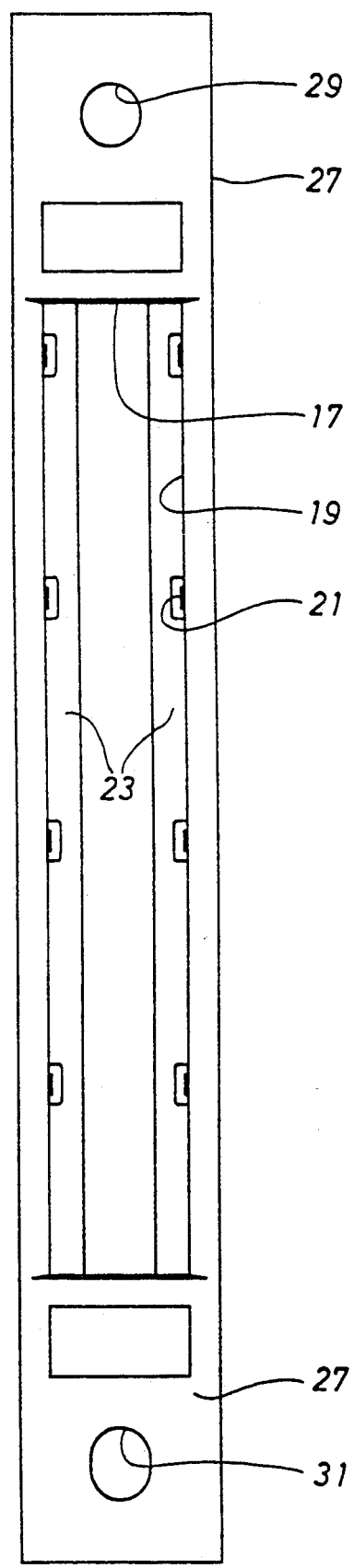
FIG. 13 is a bottom plan view of the fixing member.
Figure 14:
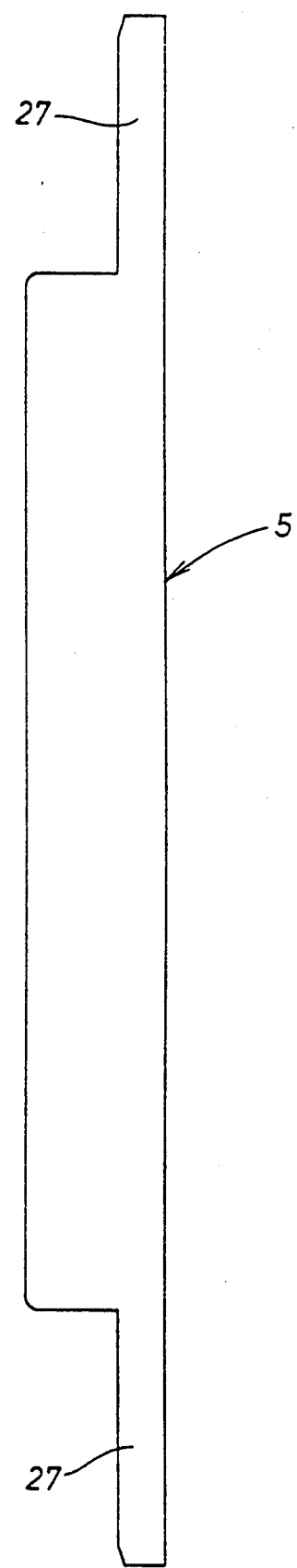
FIG. 14 is a side view of the fixing member.

As illustrated in FIGS. 6 through 8, each pair of the opposed guide fingers 7 extends or is curved toward the center axis or line of the guide member 3 in the longitudinal direction. As best shown in FIGS. 9 through 11, a projection 7a is attached to each of the guide fingers 7 at the closest point to the center line leaving a small space between each pair thereof. Supporting walls 11 for supporting the guide fingers 7 are respectively provided with an engaging aperture 13. The contact members 9 curvedly project from the bottom of the guide member 3. Each of the contact members 9 is equipped with a projection 9a at the bottom, and a pair of folded plate members 15 at the sides. The plate members 15 reinforce the contact members 9.

Figure 15:
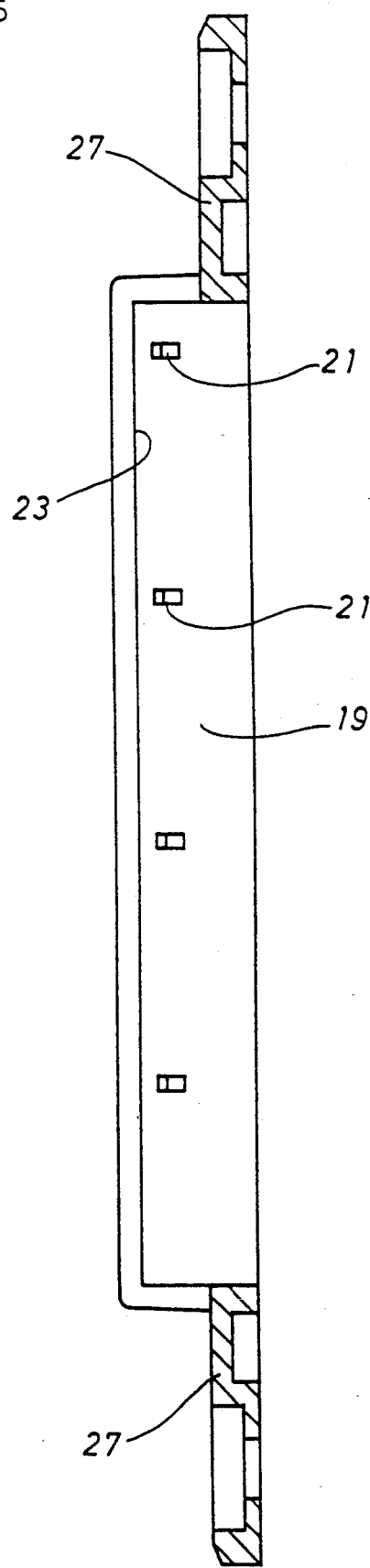
FIG. 15 is a sectional side view of the fixing member.
Figure 16:
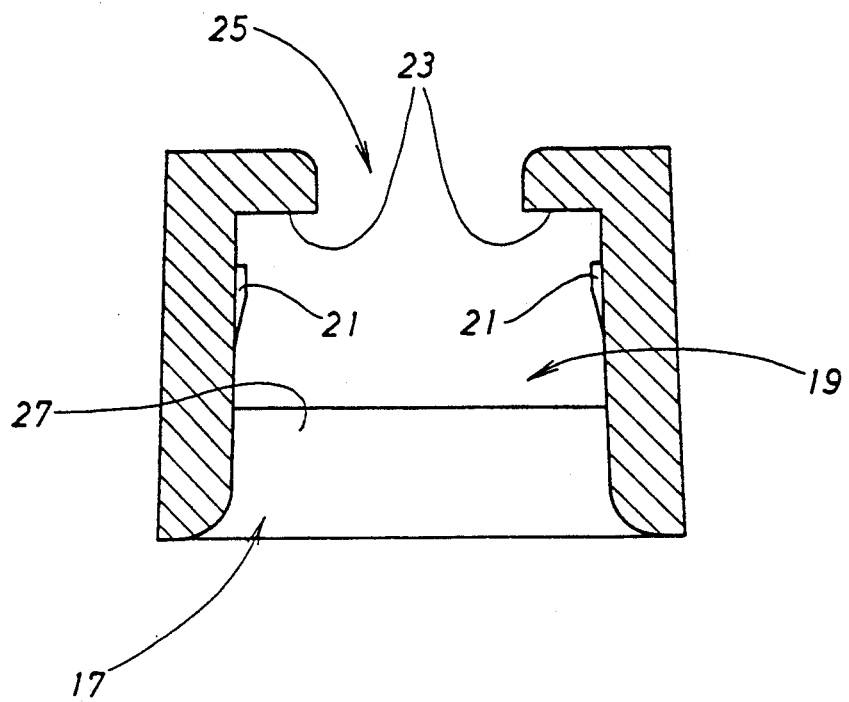
FIG. 16 is a sectional view taken along 16—16 line of FIG. 12, showing a section of the fixing member.
Figure 17:
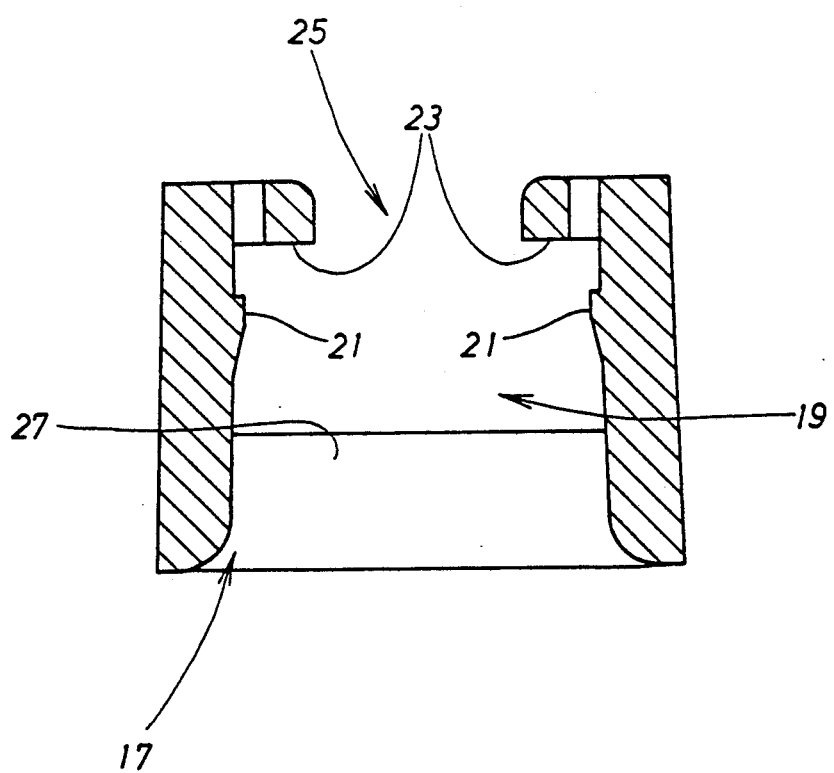
FIG. 17 is a sectional view taken along 18—18 line of FIG. 12, showing another section of the fixing member.

Turning to FIGS. 12 through 17, the fixing member 5, which is formed of insulative resin, comprises a receiving portion 19 for receiving the guide member 3 from an inlet 17 formed at the bottom. As best shown in FIGS. 15 through 17, the receiving portion 19 is provided with a plurality of pairs of opposed engaging projections 21 at the sides which engage with the engaging apertures 13 of the guide member 3. The engaging projections 21 are tapered toward the inlet 17 to receive the guide member 3 easily. Additionally, the fixing member 5 is equipped with a pair of stoppers or opposed lip members 23 at the sides for preventing over insertion of the guide member 3. Each of the stoppers 23 are spaced a sufficient distance apart to form a passage 25 through which the printed circuit board B is inserted to contact the guide fingers 7 of the guide member 3. The fixing member 5 further comprises a pair of opposed end portions or fixtures 27 at the ends. Each of the fixtures 27 is provided with apertures 29 and 31, respectively, which receive fixing means for securing the fixtures 27 to the housing C. The aperture 31 is of elliptic configuration for a free or minor adjustment of the position of the fixtures 27.

Figure 5:
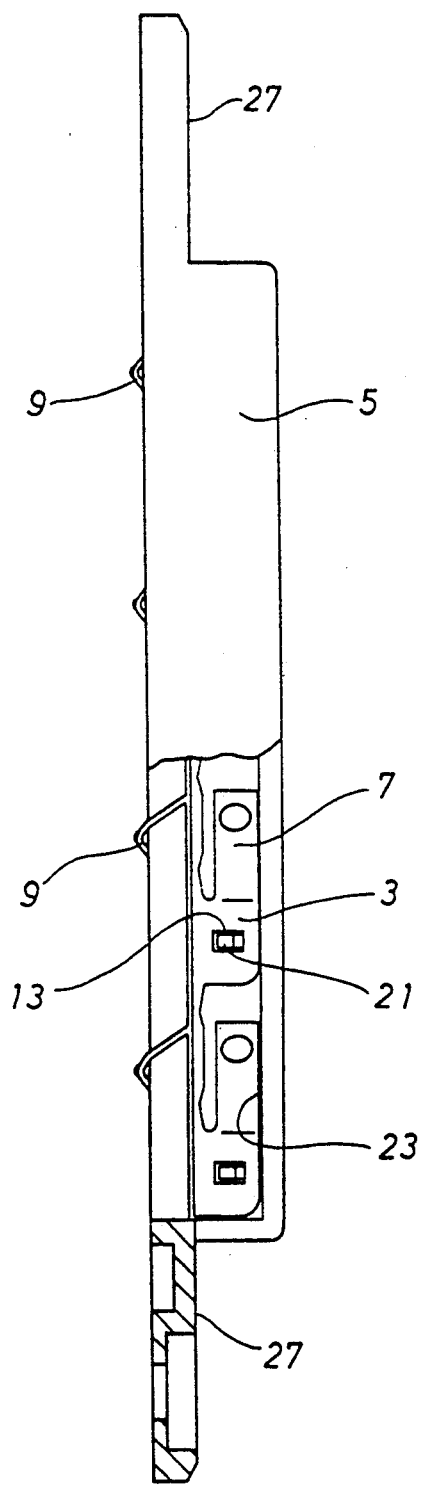
FIG. 5 is a partial sectional side view of the guide rail.

The operation of the guide rail 1 will now be described. The conductive guide member 3 is inserted into the receiving portion 19 of the insulative fixing member 5 from the inlet 17 at the bottom. The guide member 3 then reaches the stoppers 23 at the top of the fixing member 5 where the engaging projections 21 of the fixing member 5 engage with the engaging apertures 13 of the guide member 3 so as to securely fix the guide member 3 to the fixing member 5. Under this condition, the contact members 9 of the guide member 3 project out from the inlet 17 as illustrated in FIG. 5. Subsequently, the fixing member 5 containing the guide member 3 is secured to the housing C via the fixtures 27. Since the operator touches only the insulative fixing member 5 to perform the above setting, corrosion of the guide member 3 is prevented.

When the fixing member 5 is secured to the housing C, the contact members 9 deflect toward the receiving portion 19 so that the contact members 9 intimately contact the conductive portion of the housing C. Moreover, since the projections 9a of the contact members 9 have a point contact with the conductive portion, the contact pressure is greater. Thus, the connection between the conductive portion of the housing C and the guide member 3 is stabilized. Consequently, a stable reduction of the noise generated in a power source line of the printed circuit board B is attained by connecting a ground pattern of the board B with the conductive portion of the housing C via the guide rail 1.

Accordingly, the guide rail 1 of the present invention attains a stable connection between the circuit patterns of the printed circuit board B and the conductive portion of the housing C. Further, since the fixing member 5 is formed of insulative material, short circuiting of the printed circuit board B is prevented even if a means for supporting the board B contacts the fixing member 5. Moreover, since the operator touches only the insulative fixing member 5 to secure the guide rail 1 to the housing C, corrosion of the guide member 3 is prevented.

The present invention may be subject to many modifications and changes without departing from the spirit or essential characteristics thereof.

What is claimed is:

1. A guide rail for a printed circuit board mounted in a partially conductive housing for guiding the printed circuit board to a desired position in the housing and supporting the board therein, said guide rail comprising:
   a guide member formed of conductive material having a plurality of guide fingers located on a first side thereof which are positioned to guide the printed circuit board, during insertion of the printed circuit board; and a plurality of contact members adjacent a second opposed side of said guide member which are positionable to contact the partially conductive housing; and
   a securing member formed of insulative material, said securing member supporting said guide member and comprises
   an inlet formed in a housing engaging surface of said securing member through which said guide member is inserted,
   a receiving portion, communicating with said inlet, receiving said guide member such that said contact members project out from said inlet,
   a passage, remote from said inlet, through which the printed circuit board is insertable to facilitate contact between said guide fingers and the printed circuit board, and
   means for securing said guide rail to a desired surface.

2. A guide rail as in claim 1, wherein said contact members of said guide member are deflected toward said receiving portion of said securing member when said securing member is attached to the partially conductive housing and thereby forms an electrically conductive connection between said contact members and the partially conductive housing.

3. A guide rail as in claim 1, wherein said guide member comprises a plurality of opposed pairs of guide fingers position to engage the printed circuit board as it is passed through said passage.

4. A guide rail as in claim 3, wherein said guide member defines a central axis extending along a longitudinal direction of said guide member and said each opposed pair of guide fingers extends toward said central axis.

5. A guide rail as in claim 4, wherein a projection facing said central axis is attached to an end of each of said guide fingers at a point of said guide finger closest to said central axis and said projections are spaced a small distance from said central axis.

6. A guide rail as in claim 3, wherein said guide member further comprises a pair of opposed supporting walls for supporting each pair of opposed guide fingers, and said supporting walls have a plurality of engaging apertures formed therein.

7. A guide rail as in claim 1, wherein said contact members are curved members equipped with a projection adjacent an end of each of said contact members projecting out of said inlet.

8. A guide rail as in claim 7, wherein said contact members have a pair of folded plate members to reinforce said contact members.

9. A guide rail as in claim 6, wherein said receiving portion of said securing member is provided with a plurality of pairs of opposed engaging projections which are positioned to engage with said engaging apertures of said guide member when received within said receiving portion.

10. A guide rail as in claim 1, wherein said securing member has a pair of sidewalls which are provided with a pair of stop means, remote from said inlet, for preventing over insertion of said guide member into said receiving portion.

11. A guide rail as in claim 10, wherein each of said stop means is spaced a sufficient distance apart from one another to form said passage through which the printed circuit board is insertable.

12. A guide rail as in claim 1, wherein said securing member has a pair of opposed end portions which are provided with said means for securing said guide rail.

13. A guide rail as in claim 12, wherein said means for securing said guide rail comprises at least one aperture provided in each opposed end portion.

14. A guide rail as in claim 13, wherein at least one of said apertures is of elliptical configuration for facilitating positioning of said guide rail on the partially conductive housing.

15. A method of mounting a guide rail for a printed circuit board in which said guide rail comprising:
 a plurality of guide fingers located on a first side thereof which are positioned to guide the printed circuit board, during insertion of the printed circuit board, and contact a conductive pattern of the printed circuit board; and a plurality of contact members adjacent a second opposed side of said guide member which are positionable to contact the partially conductive housing; and
 a securing member formed of insulative material, said securing member supporting said guide member and comprises an inlet formed in a housing engaging surface of said securing member through which said guide member is inserted, a receiving portion, communicating with said inlet, receiving said guide member such that said contact members project out from said inlet, a passage, remote from said inlet, through which the printed circuit board is insertable to facilitate contact between said guide fingers and the printed circuit board, and means for securing said guide rail to a desired surface;
 said method comprising the steps of:
 attaching said guide rail to the partially conductive housing, via said means for securing said guide rail, and forming an electrically conductive connection between said contact members and the partially conductive housing; and
 inserting the printed circuit board into said passage of said securing member with the printed circuit board being guided by said guide fingers of said guide member which contact a conductive pattern of the printed circuit board.

16. A method of mounting a printed circuit board as in claim 15, further comprising the step of preventing said guide member from being over inserted in said securing member by providing stop means remote from said inlet in said securing member.

17. A method of mounting a printed circuit board as in claim 15, further comprising the step of providing a plurality of opposed pairs of guide fingers position to engage the printed circuit board as it is passed through said passage.

* * * * *

UNITED STATES PATENT AND TRADEMARK OFFICE
CERTIFICATE OF CORRECTION

PATENT NO. : 5,187,648

DATED : February 16, 1993

INVENTOR(S) : Fuminori ITO

It is certified that error appears in the above-identified patent and that said Letters Patent is hereby corrected as shown below:

Column 5, line 31 before "a" insert --a guide member formed of conductive material having--.

Signed and Sealed this

Sixteenth Day of November, 1993

Attest:

BRUCE LEHMAN

Attesting Officer

Commissioner of Patents and Trademarks